United States Patent
Neyret

(10) Patent No.: US 7,666,758 B2
(45) Date of Patent: Feb. 23, 2010

(54) PROCESS FOR FABRICATING A SUBSTRATE OF THE SILICON-ON-INSULATOR TYPE WITH THIN SURFACE LAYER

(75) Inventor: Eric Neyret, Sassenage (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 40 days.

(21) Appl. No.: 11/848,964

(22) Filed: Aug. 31, 2007

(65) Prior Publication Data
US 2008/0188060 A1    Aug. 7, 2008

(30) Foreign Application Priority Data
Feb. 1, 2007    (FR)    ................... 07 00718

(51) Int. Cl.
*H01L 21/20*    (2006.01)
(52) U.S. Cl. .............................. 438/458; 257/E21.122
(58) Field of Classification Search .......... 438/455–459
See application file for complete search history.

(56) References Cited

U.S. PATENT DOCUMENTS

| 5,966,620 | A | 10/1999 | Sakaguchi et al. | .......... 438/455 |
| 6,372,609 | B1 | 4/2002 | Aga et al. | .......... 438/459 |
| 7,315,064 | B2 * | 1/2008 | Mitani et al. | .......... 257/347 |
| 7,326,628 | B2 * | 2/2008 | Ben Mohamed et al. | .... 438/458 |
| 7,354,844 | B2 * | 4/2008 | Endo et al. | .......... 438/455 |
| 2003/0181001 | A1 | 9/2003 | Aga et al. | .......... 438/200 |
| 2004/0161948 | A1 | 8/2004 | Maleville et al. | .......... 438/795 |
| 2005/0026426 | A1 * | 2/2005 | Maleville et al. | .......... 438/663 |
| 2006/0160328 | A1 | 7/2006 | Daval | .......... 438/455 |
| 2006/0177991 | A1 | 8/2006 | Murakami et al. | .......... 438/455 |
| 2006/0177993 | A1 | 8/2006 | Endo et al. | .......... 438/458 |
| 2006/0189102 | A1 | 8/2006 | Barge et al. | .......... 438/475 |
| 2008/0200010 | A1 * | 8/2008 | Endo et al. | .......... 438/458 |

FOREIGN PATENT DOCUMENTS

| EP | 0 4843 344 B1 | 1/2002 |
| EP | 1 662 555 A1 | 5/2006 |
| EP | 1 688 990 A2 | 8/2006 |
| EP | 1 688 991 A2 | 8/2006 |
| FR | 2 797 713 | 2/2001 |
| FR | 2 827 423 | 2/2003 |
| FR | 2 858 462 | 2/2005 |
| FR | 2 861 497 | 4/2005 |

* cited by examiner

*Primary Examiner*—W. David Coleman
*Assistant Examiner*—Daniel Shook
(74) *Attorney, Agent, or Firm*—Winston & Strawn LLP

(57) ABSTRACT

A process for fabricating a silicon on insulator (SOI) substrate by forming a weakened zone within a semiconductor donor substrate to define a thick layer having a thickness of greater than 150 nm and form a boundary between the thick layer and a remainder of the donor substrate, bonding the donor substrate to a semiconductor receiver substrate, with one of the substrates including an oxide layer that is present between the donor and receiver substrates after bonding; detaching a remainder of the donor substrate along the weakened zone to obtain a semifinished SOI substrate comprising the receiver substrate, the oxide layer and the thick layer; and finishing the semifinished SOI substrate by thinning the thick layer to obtain a silicon layer having a thickness is less than that of the thick layer but greater than 150 nm; long annealing the semifinished SOI substrate in a gaseous atmosphere comprising hydrogen and/or argon; and thinning the thin layer to obtain an ultrathin layer with a thickness of 150 nm or less and the finished substrate.

20 Claims, 6 Drawing Sheets

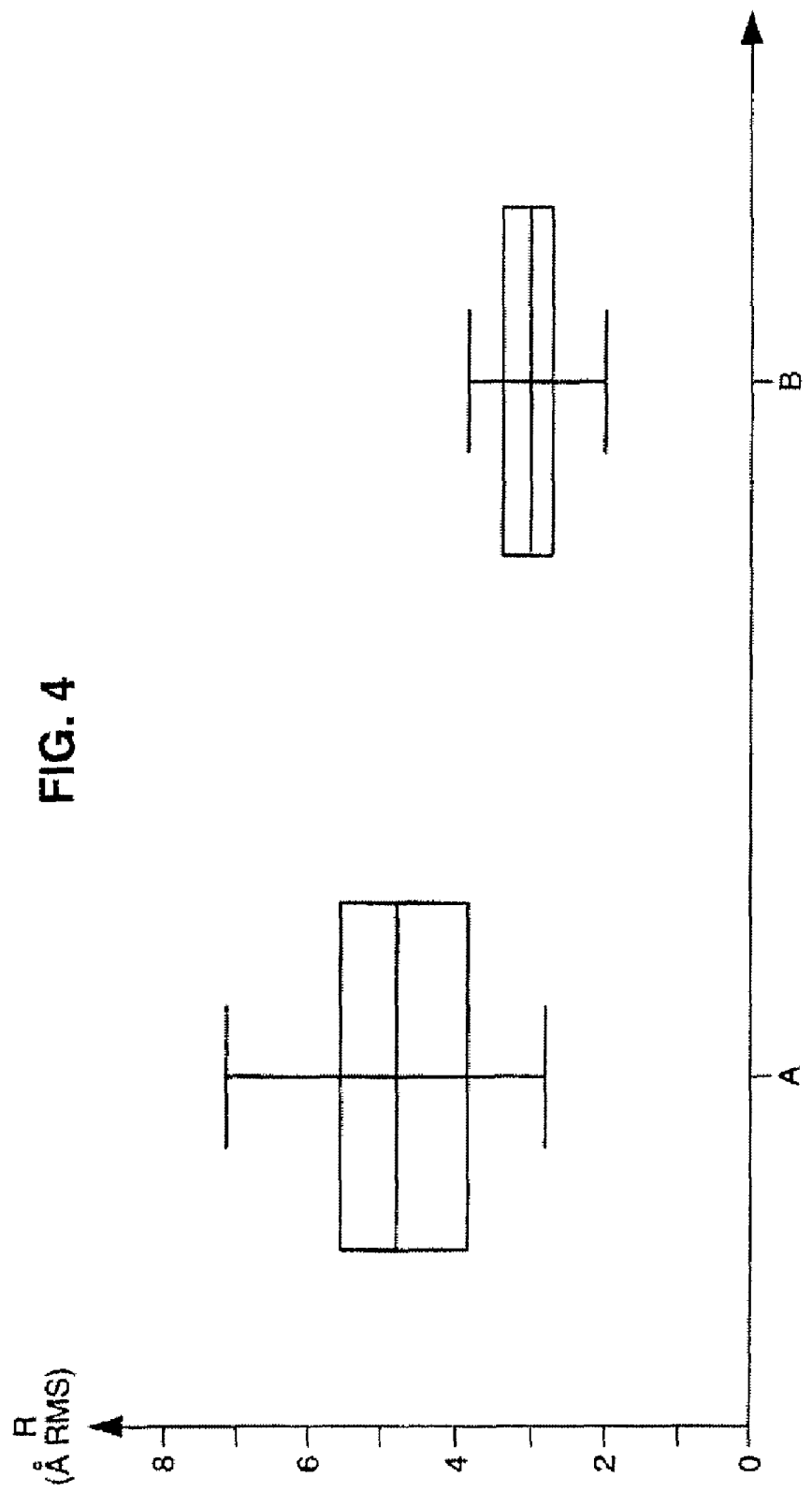

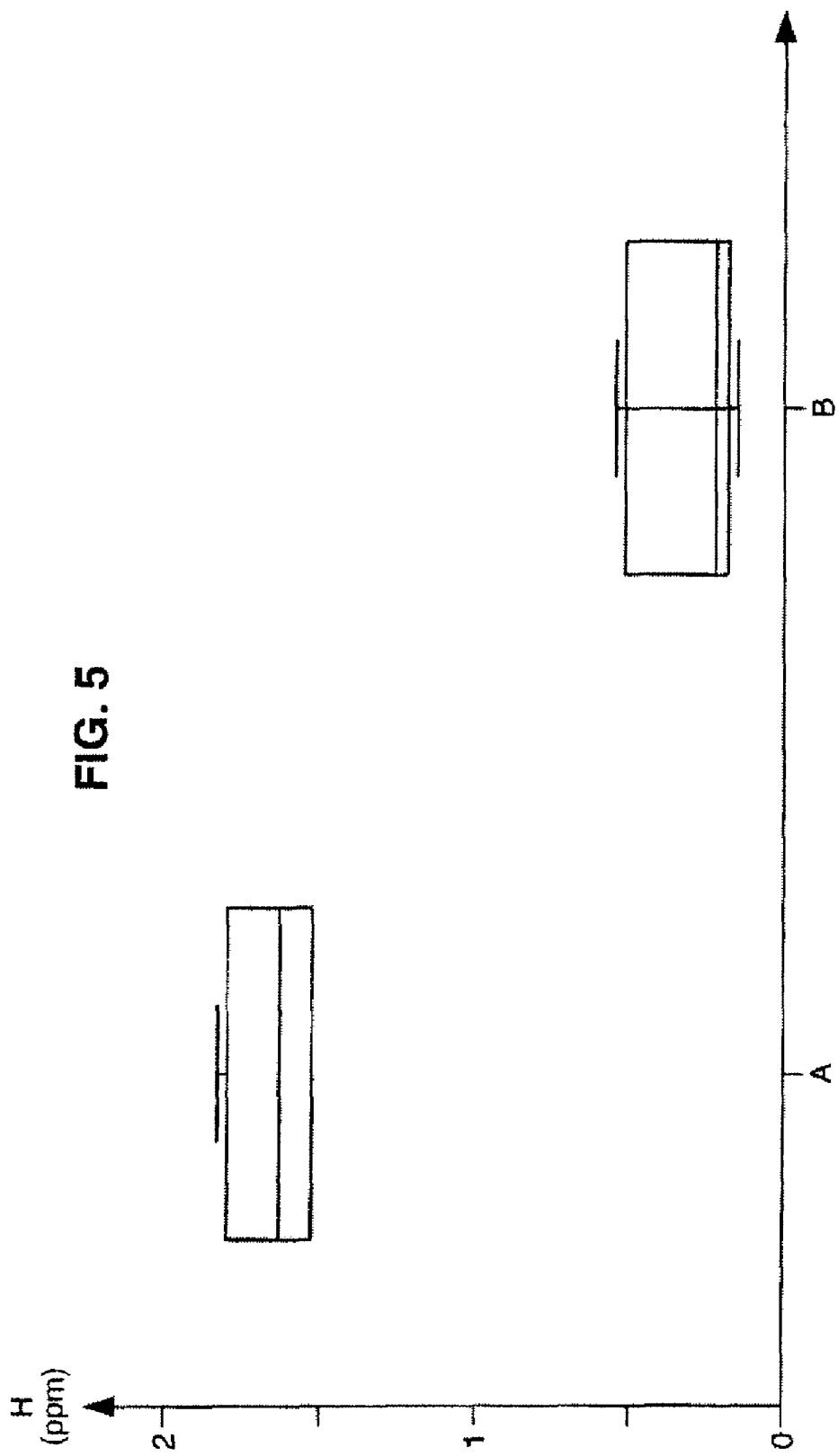

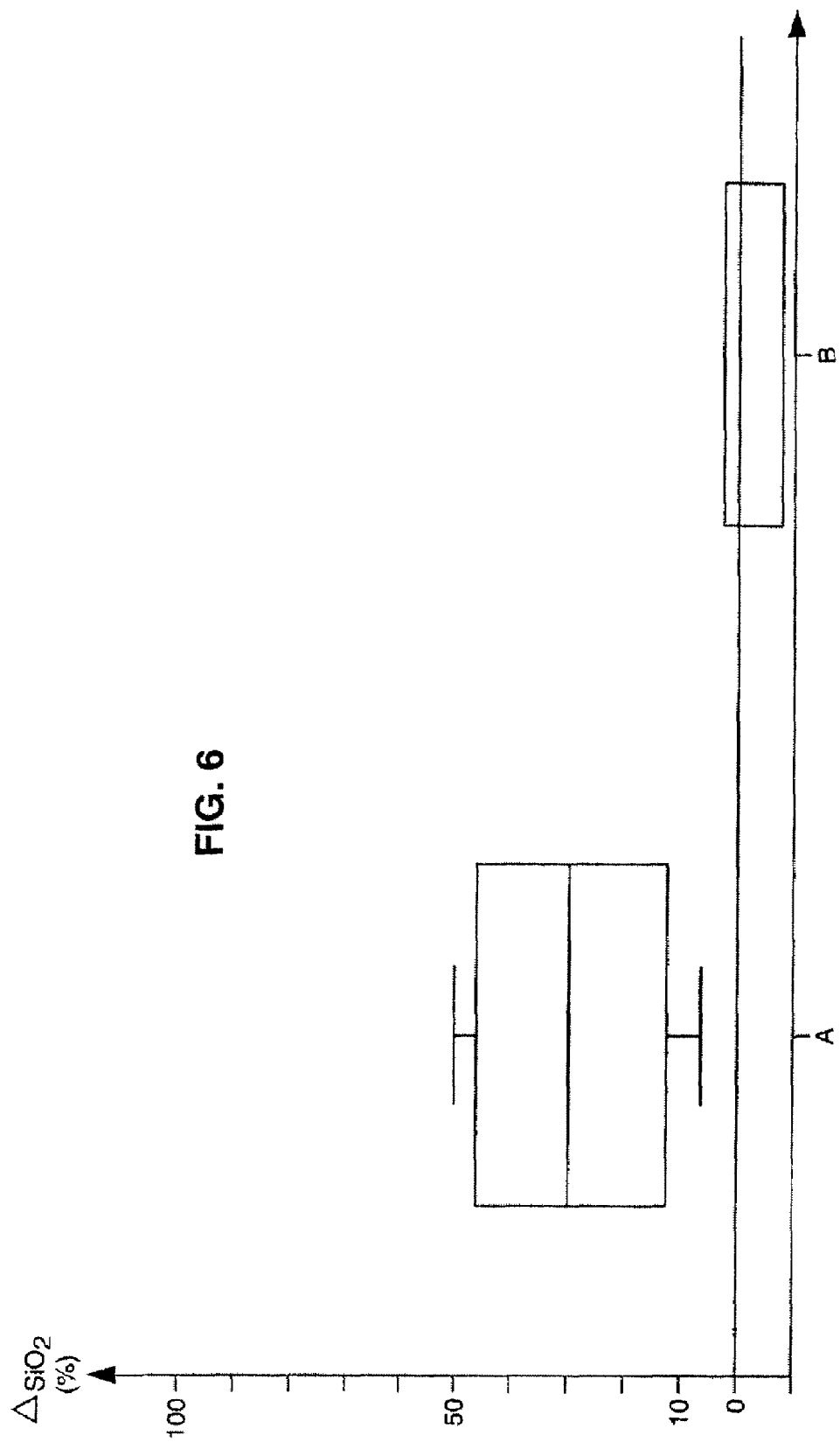

PROCESS FOR FABRICATING A SUBSTRATE OF THE SILICON-ON-INSULATOR TYPE WITH THIN SURFACE LAYER

FIELD OF THE INVENTION

The present invention relates to the field of processes for fabricating silicon on insulator (SOI) substrates. More particularly, the invention relates to the finishing steps of SOI substrates.

BACKGROUND

SOI substrates are composed of a silicon oxide ($SiO_2$) layer buried between a bulk silicon substrate and thin silicon layer. These substrates are intended to be used in the fields of electronics, optics or optoelectronics.

An example of a process for fabricating an SOI substrate is disclosed in U.S. Patent Application No. 2003/0181001. The disclosed process involves ion implantation into a surface-oxidized substrate and delamination of the wafer. This substrate is then bonded to a support and then an annealing operation is carried out at temperatures between 400° C. and 600° C. to detach a portion of the substrate.

To reduce the roughness of the newly exposed portion of the substrate, a finishing annealing operation is then carried out in an atmosphere containing hydrogen, an inert gas, or a mixture of the two gases, at a temperature between 1100° C. and 1350° C. This temperature range is chosen to limit the annealing time and to avoid any contamination by impurities, such as heavy metals.

US 2003/0181001 specifies that heat treatment is carried out by annealing for a time between 10 minutes and 8 hours, or by a technique known to those skilled in the art as RTA (rapid thermal annealing). In the latter case, this process is carried out in an RTA annealing apparatus that allows temperature increases of greater than 10° C./s, and relatively short annealing times of around 30 seconds to 1 minute. Finally, this annealing step may be followed by a sacrificial oxidation step.

The process described in US 2003/0181001 has several drawbacks, namely the partial dissolution of the buried oxide layer and the lack of homogeneity in the reduction in roughness of the silicon active layer. Annealing for several hours at the proposed temperature ranges, which may be up to 1350° C., results in at least partial dissolution of the buried silicon oxide ($SiO_2$) layer, by diffusion of the oxygen forming the silicon dioxide and by evaporation of this oxygen at the surface of the silicon active layer. For high annealing temperatures above about 1200° C., the dissolution phenomenon is also linked with the increase in solubility of oxygen in silicon and consequently its dissolution in the bulk substrate and the silicon active layer. This effect is even more pronounced for thin silicon layers with a thickness of 150 nanometers or less. In addition, the diffusion of oxygen is not homogeneous through the active layer. Consequently, the SOI substrate obtained has a buried oxide layer of poorly controlled thickness due to the diffusion phenomenon. Also, the thickness of the oxide layer is not uniform over the entire surface of the substrate.

Tests have been carried to measure these drawbacks. The results are plotted in the appended FIG. 1, which shows on the y-axis the thickness $E_{SiO2}$ of the buried silicon dioxide layer of an SOI substrate after thermal annealing, and on the x-axis the average thickness $E_{Si}$ of the silicon active layer before annealing. The thicknesses are expressed in nanometers. Curves a, b and c represent the results obtained after annealing at temperatures of 1100° C., 1150° C. and 1200° C., respectively.

Additional results are plotted FIG. 2. The y-axis represents the change in standard uniformity $\Delta_{SiO2}$ as a result of annealing the buried silicon dioxide layer and x-axis represents the thickness $E_{Si}$ of the silicon active layer before annealing, expressed in nanometers. Curves d, e and f represent the results obtained after annealing at temperatures of 1100° C., 1150° C. and 1200° C., respectively. An annealing operation at, for example, 1200° C. is an operation during which the temperature gradually rises over several hours and is then held for 5 minutes at 1200° C.

As may be seen in FIG. 1, the higher the annealing temperature, the thinner the buried $SiO_2$ layer. Moreover, the thinner the silicon active layer, the greater the reduction in the thickness of the buried silicon layer, especially for annealing above 1100° C. Thus, after annealing at 1200° C. (see curve c) and for silicon active layer thicknesses greater than 200 nanometers, a reduction in the thickness of the $SiO_2$ of around 6 nanometers (compared with curve a) is observed, as shown in FIG. 2.

The term thickness uniformity denotes the maximum deviation in thickness of the buried $SiO_2$ layer within the SOI wafer. A uniformity of 1 to 1.5 nm for a buried $SiO_2$ layer with an average thickness of 145 nm is acceptable and commonplace. Moreover, the change in thickness uniformity of the final product corresponds to the change between the thickness uniformity values measured before and after the annealing, respectively. The 0% value of the change in uniformity in FIG. 2 indicates no change in thickness uniformity; the uniformity remains the same as that of the buried $SiO_2$ layer before the annealing. So, an $SiO_2$ layer whose thickness before annealing was 145 nm, a change of thickness of about 1 to 1.5 nm is a 0% change.

For a silicon active layer with a thickness of 100 nanometers or less, however, the reduction in the thickness of the buried $SiO_2$ layer exceeds 10 nanometers (see FIG. 1). The change in uniformity may be up to 500%, as shown in curve f, having an initial uniformity value of 1 to 1.5 nm, rising to 5 to 7.5 nm after annealing. FIG. 2 also shows that this phenomenon, illustrating that the loss in thickness uniformity of the buried oxide layer is even greater for SOI substrates having a silicon active surface layer less than 60 nm. This dissolution phenomenon is more problematic the thinner the silicon dioxide ($SiO_2$) layer is.

Another drawback of this prior art process is that annealing carried out on a surface directly after it has been debonded is much less effective than annealing carried out after a prior thinning step.

U.S. Pat. No. 6,372,609 discloses a process for fabricating an SOI substrate that includes the steps of detaching and transferring a silicon layer that has been formed by the implantation of hydrogen ions. According to this process, the finishing requires sacrificial oxidation, deoxidation of the sacrificial silicon layer, and then heat treatment in a reducing atmosphere, specifically RTA (rapid thermal annealing) at 1000° C. to 1300° C. for 1 to 60 seconds. The process disclosed in U.S. Pat. No. 6,372,609 involves heat treatment of an SOI substrate where the silicon surface layer has a thickness of at least 230 nanometers.

However, when an SOI substrate is desired with a silicon surface layer of less that 200 nm, the process becomes far more difficult, due to the challenges discussed above. The solutions of the prior art do not address these challenges. Accordingly, there is a need in the art for a process for fabricating an SOI substrate in which the silicon surface layer has a thickness less than 200 nanometers, preferably less than 150 nm, and a buried oxide layer having a uniform thickness, wherein the buried oxide layer is also thin.

SUMMARY OF THE INVENTION

The present invention solves the aforementioned drawbacks of the prior art. In particular, the invention provides a fabrication process which makes it possible to obtain an SOI substrate having a silicon active layer with a thickness of less than 150 nanometers.

For this purpose, the invention relates a process for fabricating an SOI substrate that includes forming a weakened zone within a semiconductor donor substrate to define a thick layer having a thickness of greater 150 nm and form a boundary between the thick layer and a remainder of the donor substrate. The donor substrate is then bonded to a semiconductor receiver substrate. Either the donor or the receiver substrate includes an oxide layer, such that the oxide layer is disposed between the donor and receiver substrates after bonding. Next, a remainder of the donor substrate is detached along the weakened zone to obtain a semifinished SOI substrate comprising the receiver substrate, the oxide layer and the thick layer.

The semifinished SOI substrate is finished by thinning the thick silicon layer to obtain a thin layer having a thickness less than that of the thick layer but greater than 150 nm, long annealing the semifinished SOI substrate in a gaseous atmosphere comprising hydrogen, argon or mixtures thereof, and thinning the thin layer to obtain an ultrathin layer with a thickness of 150 nm or less thus providing the finished substrate.

In a preferred embodiment of the invention, the receiver substrate comprises silicon. In a particularly preferred embodiment, the donor substrate also comprises silicon so that thick, thin, and ultrathin layers also comprise silicon. In this embodiment, the oxide is silicon dioxide. The silicon dioxide layer can be formed by oxidation of the receiver substrate, donor substrate, or both prior to bonding.

According to other advantageous and nonlimiting features of the invention, taken individually or in combination:

long annealing is carried out in a temperature range from 950° C. to 1350° C., preferably from 1100° C. to 1250° C.;

long annealing is carried out for a time of at least 10 minutes;

thinning of the thick silicon layer is carried out by sacrificial oxidation followed by deoxidation;

thinning of the thin silicon layer is carried out by chemical-mechanical polishing;

the thinning of the thin silicon layer is carried out by sacrificial oxidation followed by deoxidation;

sacrificial oxidation is carried out under dry or wet conditions at a temperature between 700° C. and 1100° C.;

the weakened zone is formed by implantation of atomic or ionic species into the donor substrate;

the fabricating process includes forming the silicon dioxide layer by thermal oxidation of the donor substrate and/or of the receiver substrate and bonding the two together with the silicon dioxide layer at the interface;

the ultrathin silicon layer has, over its entire extent, an RMS surface roughness of less than 3 ångstroms over a scanning area of 30 µm×30 µm;

the thickness of the buried silicon dioxide ($SiO_2$) layer is 50 nanometers or less;

the buried silicon dioxide ($SiO_2$) layer has a uniform thickness is equal to about 1.8 nm or better; and the difference in thickness uniformity of the buried silicon dioxide ($SiO_2$) layer before and after the long smoothing annealing is less than 20%, and preferably less than 10%.

BRIEF DESCRIPTION OF THE DRAWINGS

Other features and advantages of the invention will become apparent from the description that will now be given, with reference to the appended drawings, which show, by way of indication but implying no limitation, one possible embodiment thereof.

In these drawings:

FIG. 4 is a comparison of the surface roughness of a prior art SOI substrates (A) versus SOI substrates prepared in accordance with one embodiment of the present invention (B);

FIG. 5 is a graph illustrating background noise, on the surface of SOI substrates obtained by a process of the prior art (A) and by the process according to one embodiment of the invention (B); and FIG. 6 is a graph showing the change in thickness uniformity $\Delta_{SiO2}$ for SOI substrates obtained by a process of the prior art (A) and by the process according to one embodiment of the invention (B).

DETAILED DESCRIPTION OF THE PREFERRED EMBODIMENTS

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

The process of the present invention includes a first series of steps for the formation, detachment and transfer of a thin layer onto a donor substrate, illustrated in FIGS. 3A to 3D, and a second series of steps for finishing, illustrated in FIGS. 3E to 3H.

Figure 1:
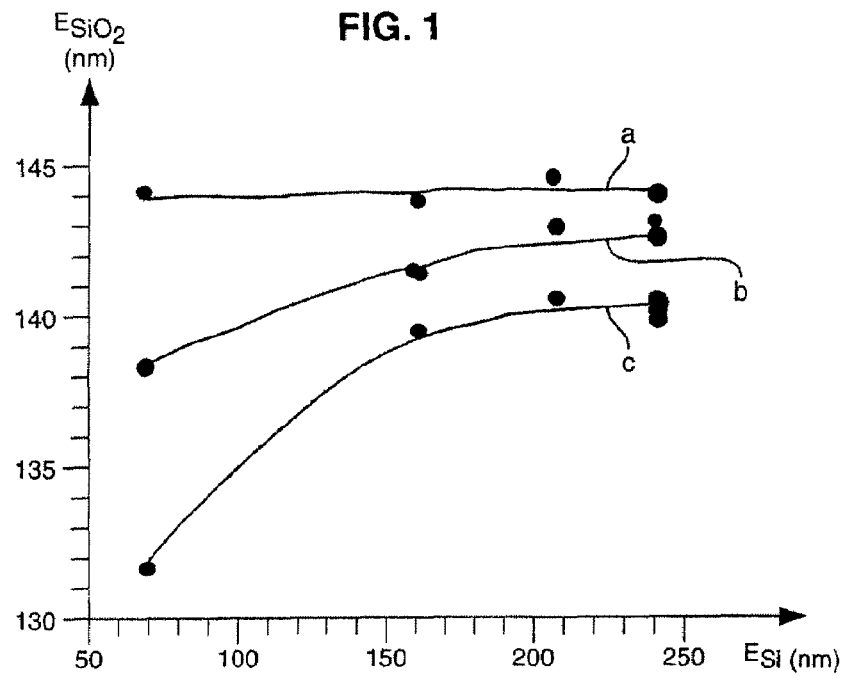
FIG. 1 is a graph showing the thickness $E_{SiO2}$ of the silicon dioxide layer of an SOI substrate after annealing as a function of the thickness $E_{Si}$ of the thin silicon layer before annealing, for heat treatments carried out at various temperatures and in accordance with the prior art.
Figure 2:
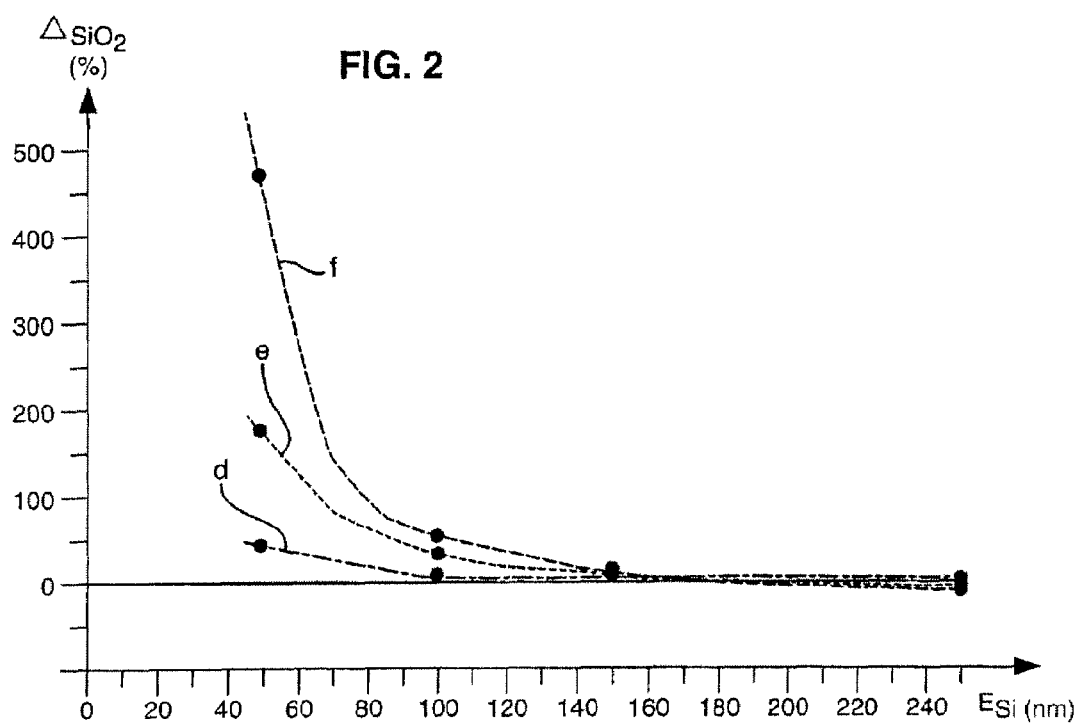
FIG. 2 is a graph showing the change in thickness uniformity $\Delta_{SiO2}$ as a result of the annealing of the silicon dioxide layer of an SOI substrate as a function of the thickness $E_{Si}$ of the thin silicon layer before annealing, for heat treatments carried out at various temperatures and in accordance with the prior art.
Figure 3A:
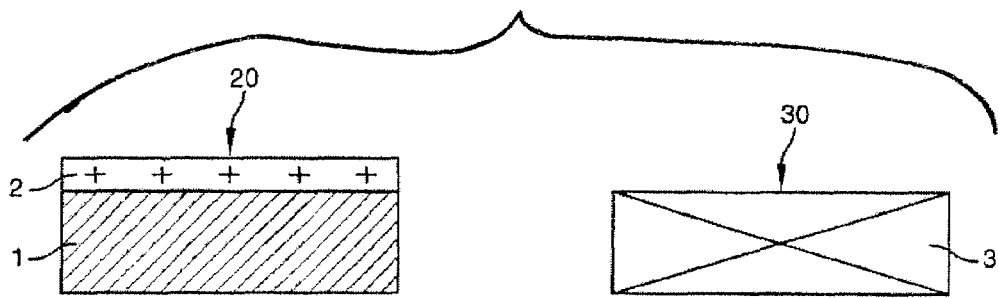
FIGS. 3A to 3H are diagrams showing the various steps of the process of forming an SOI substrate in accordance with one embodiment of the present invention.

FIG. 3A shows a donor substrate 1 made of preferably single-crystal silicon (Si) covered with a silicon dioxide ($SiO_2$) layer 2, the free surface of which bears the numerical reference 20. The oxide layer 2 may result from thermal oxidation of the donor substrate 1 or may have been formed by deposition, conventionally by one of the chemical vapor deposition techniques known to those skilled in the art by the acronyms CVD (Chemical Vapor Deposition) and "LPCVD" (Low Pressure Chemical Vapor Deposition). FIG. 3A also shows a receiver substrate 3, made of single-crystal or polycrystalline silicon.

Figure 3B:
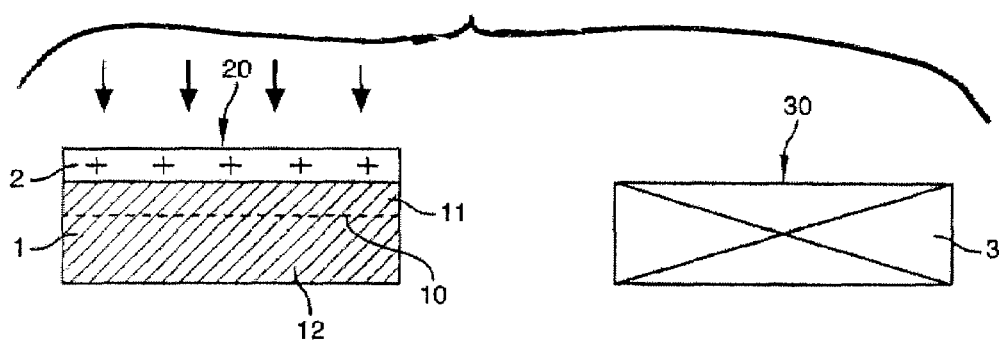

FIG. 3B shows an alternative embodiment in which there is a weakened zone 10 within the donor substrate 1. In this embodiment, the donor substrate 1 is subjected to implantation of atomic or ionic species through the oxide layer 2. The expression "implantation of atomic or ionic species" is understood to mean any bombardment by these species capable of introducing them into the donor substrate with a maximum concentration at a predetermined depth of the substrate with respect to the bombarded surface 20, for the purpose of creating therein the weakened zone 10. The weakened zone 10 forms the boundary between a layer 11 and the remainder 12 of the donor substrate 1.

This type of implantation may be carried out for example using the process known by the name SMART-CUT®. Further details concerning this process may be found in the document by G. Celler, entitled "*Frontiers of Silicon-on-Insulator*", Journal of Applied Physics, Vol. 93, no. 9, May 1, 2003, pp. 4955-4978.

The implantation of atomic or ionic species may be a single implantation, that is to say implantation of a single atomic species, such as for example an implantation of hydrogen, helium or another rare gas. The implantation may also be a co-implantation of atomic or ionic species, that is to say successive implantation of at least two different species, such as co-implantation of hydrogen and helium.

The following implantation conditions may be used as an example:

implantation of just hydrogen: the implantation dose is preferably between $4 \times 10^{16}$ H$^+$/cm$^2$ and $7 \times 10^{16}$ H$^+$/cm$^2$ and the implantation energy between 20 keV and 100 keV;

co-implantation of helium and hydrogen: preferably, in the case of helium, the implantation dose is between $0.5 \times 10^{16}$ He$^+$/cm$^2$ and $2 \times 10^{16}$ He$^+$/cm$^2$ and the implantation energy between 20 keV and 100 keV, and in the case of hydrogen, the implantation dose is between $0.5 \times 10^{16}$ H$^+$/cm$^2$ and $2 \times 10^{16}$ H$^+$/cm$^2$ and the implantation energy between 20 keV and 100 keV.

In the case of co-implantation of hydrogen and helium, the helium is preferably implanted before the hydrogen. This implantation or co-implantation is carried out so that the thickness of the layer 11 formed is at least 150 nm. In the rest of the description and the claims, and for the purpose of simplification, this layer 11 is referred to as the thick layer.

The weakened zone 10 can also be produced as a porous zone, obtained by the process known to those skilled in the art as the ELTRAN process.

Figure 3C:
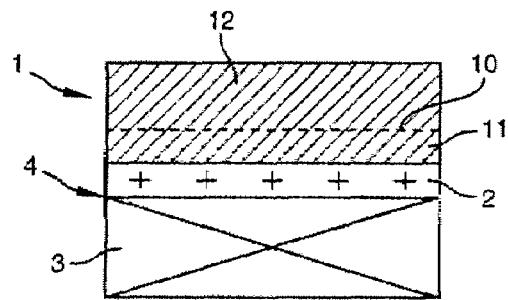

FIG. 3C shows the step in which the receiver substrate 3 is brought into contact with the donor substrate 1. Specifically, face 30 of the receiver substrate 3 is brought into contact with face 20 of the SiO$_2$ layer 2 of the donor substrate 1. The bonding between the two substrates preferably, but not necessarily, takes place by molecular adhesion and the bonding interface bears the numerical reference 4.

Although this has not been shown in the Figures, it would also be conceivable to form or deposit the SiO$_2$ layer 2 on the receiver substrate 3 and then to bond the assembly to a donor substrate 1 that has already undergone the implantation for forming the weakened zone 10. However, in this case, it would be preferable to form or deposit a protective insulation layer on the donor substrate 1 before carrying out the implantation. The protective layer can be removed before the bonding, if desired.

Figure 3D:
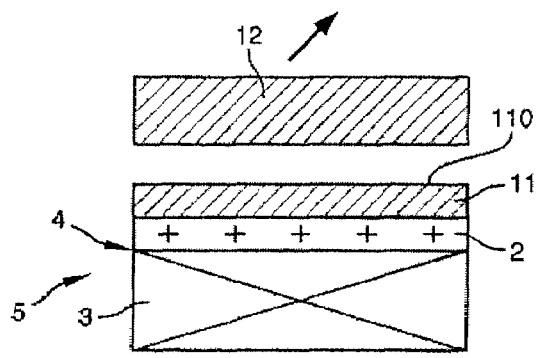
Figure 3E:
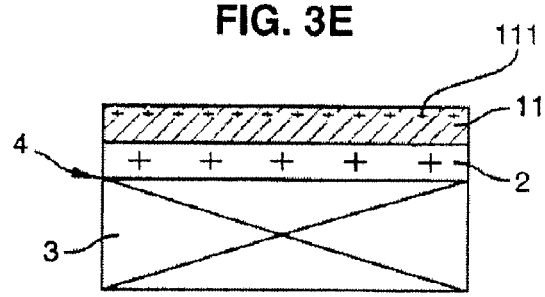

FIG. 3D shows that the process continues with the detachment of the remainder 12 of the donor substrate, along the weakened zone 10. This results in the thick layer 11 being affixed onto the support substrate 3, more precisely onto the oxide layer 2. Detachment may be accomplished by any appropriate technique known to those skilled in the art, for example by applying stresses of a thermal, mechanical or chemical origin. Detachment results in a substrate of the SOI (semi-conductor on insulator) type, indicated by reference numeral 5.

The second series of steps performed in accordance with the invention is the series of finishing steps. First, the thick layer 11 is thinned. This step may be accomplished by sacrificial oxidation followed by deoxidation. The sacrificial oxidation operation is carried out on the surface of the thick layer 11. This operation is made up of an oxidation step, shown in FIG. 3E, an optional heat treatment and then a deoxidation step shown in FIG. 3F. The oxidation step is preferably carried out at a temperature between about 700° C. and about 1100° C. It may be performed under dry conditions, for example, by heating the SOI substrate in a gaseous atmosphere, or under wet conditions, such as in an atmosphere containing water vapor. Whether the oxidation is carried out under dry or wet conditions, the oxidation atmosphere may also be charged with hydrochloric acid. The oxidation step results in the formation of a silicon dioxide (SiO$_2$) layer 111 on the surface of the thick silicon layer 11.

An optional heat treatment that may follow is long annealing. The heat treatment may be accomplished by increasing the temperature at a constant or varying rate to temperature of above about 1000° C., and preferably between about 1100° C. and 1200° C., in a nonoxidizing gaseous atmosphere. The gaseous atmosphere contains, for example argon, nitrogen or other nonoxidizing gases, or a mixture of these gases. The heat treatment may also be carried out under a vacuum. The duration of this heat treatment is typically about 2 hours.

It should be noted that this heat treatment may be carried out up to a temperature of about 1200° C. without any risk of the buried SiO$_2$ layer 2 dissolving, since the upper layer 110 of the silicon layer 11 is oxidized (reference 111), thereby preventing the dissolution phenomenon of oxygen transport to the surface of the silicon layer and subsequent oxygen evaporation.

Figure 3F:
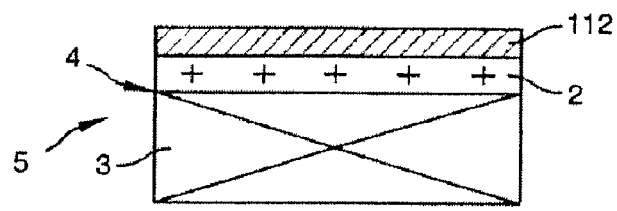

Finally, the total deoxidation step shown in FIG. 3F allows the oxide layer 111 formed during the oxidation step to be removed. This step may be accomplished by immersing the SOI substrate for a few minutes, for example, in a solution of hydrofluoric acid (HF) diluted in water to 10 or 20% by volume. This immersion is sufficient to remove the silicon dioxide layer 111, the thickness of which generally varies from about one hundred to a few hundred nanometers. This step allows removal of the portion of the thick silicon layer 11 that was damaged during detachment.

After the final step of immersion and removal of the damaged portion of the thick layer, the semifinished substrate 5' is obtained. The residual silicon layer bearing the numerical reference 112 is called the thin layer, as it is thinner than the thick layer 11. Other techniques for thinning the thick layer 11 are also conceivable, such as, for example, dry etching or wet etching.

Figure 3G:
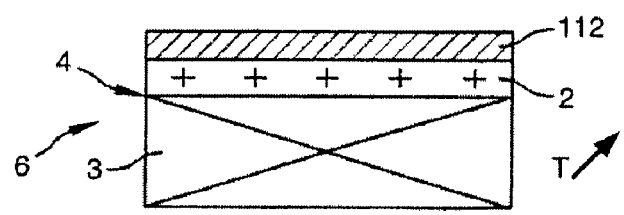

According to one embodiment of the invention, the thinning of the thick layer 11 is carried out so that the thin layer 112 still has a thickness of greater than 150 nm before the next step, thermal annealing, is performed, as shown in FIG. 3G. Thermal annealing to smooth the SOI substrate is carried out in a gaseous atmosphere of hydrogen and/or argon, in the absence of oxygen, at a temperature between about 950° C. and about 1350° C., preferably between about 1000° C. and about 1250° C. This annealing is called long annealing, classified by holding the SOI substrate in the aforementioned temperature range for at least about 10 minutes and for a maximum time of a few hours, possibly even up to 8 hours.

This annealing is carried out in a suitable furnace, as is known to one of skill in the art. It is noted that, for a time of less than 10 minutes, the treatment is ineffective, and when it exceeds 8 hours, the treatment is no longer economic in terms of production costs.

The finished SOI substrate obtained bears the reference 6, as shown in FIG. 3G.

Figure 3H:
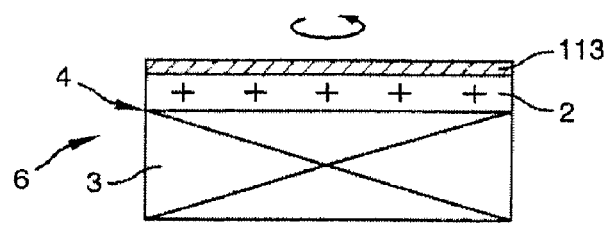

The last step of the process, shown in FIG. 3H, is an additional thinning of the thin silicon layer 112 which, once thinned, is called the ultrathin layer and bears the reference 113. This additional thinning performed to achieve a thickness of less than 150 nm for the ultrathin layer.

The Applicant has conducted research and observed that the finishing steps of the present invention surprisingly result in an ultrathin layer that has a reduced surface roughness. Furthermore, the method of the present invention considerably reduces the dissolution of the buried oxide ($SiO_2$) layer 2. The results are plotted in FIG. 4, which shows, on the y-axis, the RMS roughness R of the silicon ultrathin layer 113 of various SOI substrates, expressed in ångstroms for a scanning area of 30 μm×30 μm. Roughness is expressed by an RMS (Root Mean Square) value. It is measured by AFM (Atomic Force Microscopy), the tip of which scans an area expressed in square microns.

Reference item A represents SOI substrates obtained by a prior art process in which the finishing steps included a long annealing operation, carried out immediately after the step of detaching and transferring the thick layer. Reference item B represents a second batch SOI substrates obtained by a process where the finishing steps were performed in accordance with the invention, including an oxidation step, followed by a sacrificial deoxidation step before the detachment, and then a long annealing step.

FIG. 4 illustrates the significant reduction in the roughness of the ultrathin layer 113. Additionally, the RMS roughness values obtained are small, less than 5 or even 4 ångstroms for a scanning area of 30 μm×30 μm, and are reproducible, as indicated by the low scatter in the values obtained for B.

FIG. 5 illustrates the value of the mean haze of the substrates A and B. The term "haze" is used to characterize the uniformity of the roughness over an entire area. This haze value, measured in ppm, is obtained by a method using the optical reflectivity properties of the surface to be characterized, and corresponds to an optical "background noise" scattered by the surface, owing to microscopic variations in roughness across the surface at the atomic level. The haze value is correlated in particular with the roughness and the defectiveness of a surface. A low haze value H corresponds to a good surface finish. The haze measurement is preferably carried out using an instrument of the SURFSCAN SP2® type, sold by the company KLA TENCOR. As shown in FIG. 5, there is a substantial reduction in the average haze value H for the substrates of batch B.

Measurements were also taken for the difference in thickness uniformity of the buried $SiO_2$ layer on substrates A and B before and after long annealing, and the results are plotted in FIG. 6. The 0% change value corresponds to an $SiO_2$ thickness uniformity that is acceptable and commonplace (equivalent to the uniformity of the substrate before the long annealing). This is the numerical equivalent of a thickness variation of around 1 to 1.5 nm for an $SiO_2$ layer having an initial thickness of about 145 nm.

The results obtained for batch B show that, unlike batch A, the $SiO_2$ thickness uniformity of the product after annealing is close to the value of this uniformity before annealing. In addition, these superior results are reproducible.

The term "about," as used herein, should generally be understood to refer to both numbers in a range of numerals. Moreover, all numerical ranges herein should be understood to include each whole integer within the range.

EXAMPLES

These examples are for illustrative purposes only, and are not to be construed as limiting the appended claims.

An illustrative example of the invention and a counter-example are presented below.

Example

A silicon donor substrate, covered with a 50 nanometer silicon dioxide layer, underwent a successive co-implantation of helium and then hydrogen with the parameters mentioned below:

helium: dose=$1\times10^{16}$ $He^+/cm^2$; energy=50 keV;

hydrogen: dose=$1\times10^{16}$ $H^+/cm^2$; energy=30 keV.

After the $SiO_2$ layer was bonded onto a silicon receiver substrate, the process of detaching and transferring the $SiO_2$ layer was carried out, resulting in a thick silicon layer with a thickness of about 200 nanometers.

This detachment step was carried out by annealing at a temperature of about 500° C.

The thick silicon layer then underwent a sacrificial oxidation step of dioxidation followed by deoxidation, to obtain a thin silicon layer with a thickness of more than 150 nanometers on top of the buried silicon dioxide layer. Next, a thermal annealing operation was carried out for a time of 4 hours, at a temperature of about 1200° C., in a gaseous atmosphere containing exclusively hydrogen and argon. The RMS roughness of the surface of the thin silicon layer obtained was from 2 to 3 ångströms for an AFM scanning area of 30 μm×30 μm.

Finally, an additional thinning step was carried out.

The thickness of the buried oxide ($SiO_2$) layer was around 50 nm and remained almost uniform over its entire surface. The measured thickness uniformity of the final product was better than 1.8 nm, for an initial $SiO_2$ thickness of 50 nm, i.e. less than 20% greater than the acceptable and commonplace thickness uniformity of 1 to 1.5 nm discussed in the Background Section of the application.

Counter-example

A silicon donor substrate, covered with a 50 nanometer silicon dioxide layer, underwent a successive co-implantation of helium and hydrogen with the parameters mentioned below:

helium: dose=$1\times10^{16}$ $He^+/cm^2$; energy=50 keV;

hydrogen: dose=$1\times10^{16}$ $H^+/cm^2$; energy=30 keV.

After the $SiO_2$ layer was bonded onto a silicon receiver substrate, the process of detaching and transferring the $SiO_2$ layer was carried out, resulting in a thick silicon layer with a thickness of about 200 nanometers. This detachment step was carried out by annealing at a temperature of about 500° C.

Next, a sacrificial oxidation step was carried out, but on a greater portion/larger area of the donor substrate, to produce a thin silicon layer with a thickness of 100 nm. The same thermal annealing operation as in the previous Example was performed.

This time it was found that the buried silicon dioxide ($SiO_2$) layer was no longer of uniform thickness. The measured thickness variations (i.e. the uniformity) reached 2.2 nm, meaning that they were more than 50% higher than the acceptable and commonplace thickness uniformity of 1 to 1.5 nm.

This counter example illustrates that the process of the present invention, and in particular the finishing steps, achieves a result that prior art processes cannot, namely a uniform thickness of the silicon oxide layer.

Although preferred embodiments of the invention have been described in the foregoing description, it will be understood that the invention is not limited to the specific embodiments disclosed herein but is capable of numerous modifications by one of ordinary skill in the art. It will be understood that the materials used and the chemical and pharmaceutical details may be slightly different or modified from the descriptions herein without departing from the methods and compositions disclosed and taught by the present invention.

What is claimed is:

1. A process for fabricating a silicon on insulator (SOI) substrate which comprises:
    forming a weakened zone within a semiconductor donor substrate to define a thick layer having a thickness of greater than 150 nm and form a boundary between the thick layer and a remainder of the donor substrate;
    bonding the donor substrate to a semiconductor receiver substrate, with one of the substrates including an oxide layer that is present between the donor and receiver substrate after bonding;
    detaching a remainder of the donor substrate along the weakened zone to obtain a semifinished SOI substrate comprising the receiver substrate, the oxide layer and the thick layer; and
    finishing the semifinished SOI substrate by:
        thinning the thick layer to obtain a thin layer having an exposed surface and a thickness is less than that of the thick layer but greater than 150 nm;
        long annealing the exposed surface of the thin layer of the semifinished SOI substrate in a gaseous atmosphere comprising hydrogen, argon or a mixture thereof, wherein the long anneal is conducted after thinning the thick layer; and
        thinning the thin layer to obtain an ultrathin layer having a thickness of 150 nm or less after long annealing the thin layer, thus obtaining the finished substrate.

2. A process for fabricating a silicon on insulator (SOI) substrate which comprises:
    forming a weakened zone within a semiconductor donor substrate to define a thick layer having a thickness of greater than 150 nm and form a boundary between the thick layer and a remainder of the donor substrate;
    bonding the donor substrate to a semiconductor receiver substrate, with one of the substrates including an oxide layer having a thickness of 50 nanometers or less and a thickness uniformity of 1.8 nm or less, with the oxide layer present between the donor and receiver substrate after bonding;
    detaching a remainder of the donor substrate along the weakened zone to obtain a semifinished SOI substrate comprising the receiver substrate, the oxide layer and the thick layer; and
    finishing the semifinished SOI substrate by:
        thinning the thick layer to obtain a thin layer having an exposed surface and a thickness is less than that of the thick layer but greater than 150 nm;
        long annealing the exposed surface of the thin layer of the semifinished SOI substrate in a gaseous atmosphere comprising hydrogen, argon or a mixture thereof, wherein the long anneal is conducted after thinning the thick layer; and
        thinning the thin layer to obtain an ultrathin layer having a thickness of 150 nm or less after long annealing the thin layer, thus obtaining the finished substrate.

3. The process of claim 1, wherein long annealing is carried out at a temperature range of 950° C. to 1350° C.

4. The process of claim 1, wherein long annealing is carried out for at least 10 minutes.

5. The process of claim 1, wherein thinning the thick layer comprises sacrificial oxidation followed by deoxidization.

6. The process of claim 1, wherein thinning of the thin silicon layer comprises chemical-mechanical polishing.

7. The process claim 1, wherein thinning the thin layer comprises sacrificial oxidation followed by deoxidization.

8. The process of claim 1, wherein forming the weakened zone comprises implanting atomic or ionic species in the donor substrate.

9. The process of claim 1, further comprising forming the oxide layer by thermal oxidation of the donor substrate, thermal oxidation of the receiver substrate, or both prior to bonding the two donor and receiver substrates to each other, so that the oxide layer lies at the interface.

10. The process of claim 1, wherein the ultrathin layer has, over its entire extent, an RMS surface roughness of less than 3 ångströms over a scanning area of 30 μm×30 μm.

11. The process of claim 1, wherein the oxide layer has a thickness of 50 nanometers or less.

12. The process of claim 1, wherein the oxide layer has a thickness uniformity of 1.8 nm or less.

13. The process of claim 1, wherein the semiconductor receiver substrate comprises silicon.

14. The process of claim 3, wherein long annealing is carried out at a temperature range of 110020 to 1250° C.

15. The process of claim 5, wherein sacrificial oxidation is carried out under dry or wet conditions, at a temperature between 700° C. and 1100° C.

16. The process of claim 7, wherein sacrificial oxidation is carried out under dry or wet conditions, at a temperature between 700° C. and 1100° C.

17. The process of claim 11, wherein the oxide layer has a difference in thickness uniformity of less than 20%, before versus after the long smoothing annealing.

18. The process of claim 11, wherein the oxide layer has a difference in thickness uniformity of preferably less than 10%, before versus after the long smoothing annealing.

19. The process of claim 13, wherein the donor substrate comprises silicon, so that the thick, thin, and ultrathin layers also comprise silicon.

20. The process of claim 19, further comprising forming the oxide layer as silicon dioxide either by thermal oxidation of the donor substrate, thermal oxidation of the receiver substrate, or both prior to bonding the donor and receiver substrates to each other, so that the silicon oxide layer lies at an interface between the substrates.

* * * * *

UNITED STATES PATENT AND TRADEMARK OFFICE
CERTIFICATE OF CORRECTION

PATENT NO. : 7,666,758 B2  Page 1 of 1
APPLICATION NO. : 11/848964
DATED : February 23, 2010
INVENTOR(S) : Neyret It is certified that error appears in the above-identified patent and that said Letters Patent is hereby corrected as shown below:

Title Page:
Item (56) References Cited, FOREIGN PATENT DOCUMENTS
Change the publication number and publication date of the first reference from "0 4843 344 B1 1/2002" to -- 0 843 344 B1   05/1998 --; and
After "FR 2 827 423" change the publication date of "2/2003" to -- 1/2003 --.

Signed and Sealed this

Thirtieth Day of March, 2010

David J. Kappos
*Director of the United States Patent and Trademark Office*